United States Patent
Tang et al.

(10) Patent No.: US 11,211,592 B2
(45) Date of Patent: Dec. 28, 2021

(54) ORGANIC LUMINESCENT SUBSTRATE, PREPARATION METHOD THEREOF, DISPLAY APPARATUS, AND DISPLAY DRIVING METHOD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Guoqiang Tang, Beijing (CN); Yingsong Xu, Beijing (CN); Nan Zhao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 148 days.

(21) Appl. No.: 16/347,707

(22) PCT Filed: Nov. 20, 2018

(86) PCT No.: PCT/CN2018/116391
§ 371 (c)(1),
(2) Date: May 6, 2019

(87) PCT Pub. No.: WO2019/114502
PCT Pub. Date: Jun. 20, 2019

(65) Prior Publication Data
US 2020/0266393 A1 Aug. 20, 2020

(30) Foreign Application Priority Data
Dec. 12, 2017 (CN) .......................... 201711320689.6

(51) Int. Cl.
*H01L 51/52* (2006.01)
*G09G 3/3266* (2016.01)
(Continued)

(52) U.S. Cl.
CPC ....... *H01L 51/5296* (2013.01); *G09G 3/3266* (2013.01); *G09G 3/3291* (2013.01);
(Continued)

(58) Field of Classification Search
CPC ............... H01L 51/5296; H01L 27/283; H01L 27/3246; H01L 27/3276; H01L 51/56;
(Continued)

(56) References Cited

U.S. PATENT DOCUMENTS 8,182,304 B2   5/2012   Suh et al.
2005/0242350 A1* 11/2005 Bae ..................... H01L 27/3246
                                                     257/59
(Continued)

FOREIGN PATENT DOCUMENTS

CN   1802054 A    7/2006
CN   101076893 A  11/2007
(Continued)

OTHER PUBLICATIONS

Namdas et al., 'Organic light emitting complimentary inverters', Applied Physics Letters 96, 043304, pp. 043304-1 to 043304-3, 2010. (Year: 2010).*
(Continued)

*Primary Examiner* — S M Sohel Imtiaz
(74) *Attorney, Agent, or Firm* — Westerman, Hattori, Daniels & Adrian, LLP

(57) ABSTRACT

The present disclosure relates to an organic luminescent substrate. The organic luminescent substrate may include a first organic luminescent field effect transistor and a second organic luminescent field effect transistor. The first organic
(Continued)

luminescent field effect transistor may include a first gate electrode, a first electrode, a second electrode, and a first active luminescent layer. The second organic luminescent field effect transistor may include a second gate electrode, a third electrode, a fourth electrode, and a second active luminescent layer. One of the first organic luminescent field effect transistor and the second organic luminescent field effect transistor may be an N-type transistor and the other one may be a P-type transistor. The first gate electrode may be coupled to the second gate electrode.

12 Claims, 15 Drawing Sheets

(51) Int. Cl.
*G09G 3/3291* (2016.01)
*H01L 27/28* (2006.01)
*H01L 27/32* (2006.01)
*H01L 51/56* (2006.01)

(52) U.S. Cl.
CPC ........ *H01L 27/283* (2013.01); *H01L 27/3246* (2013.01); *H01L 27/3276* (2013.01); *H01L 51/56* (2013.01)

(58) Field of Classification Search
CPC . H01L 27/3202; G09G 3/3266; G09G 3/3291
See application file for complete search history.

(56) References Cited

U.S. PATENT DOCUMENTS

| | | | | |
|---|---|---|---|---|
| 2006/0103290 A1* | 5/2006 | Suh | ............... | H01L 27/3244 313/463 |
| 2007/0187665 A1* | 8/2007 | Tada | ............... | H01S 5/04254 257/10 |
| 2008/0024479 A1* | 1/2008 | Jung | ............... | H01L 27/3272 345/211 |
| 2010/0090203 A1* | 4/2010 | Obata | ............... | H01L 27/3246 257/40 |
| 2010/0155705 A1* | 6/2010 | Shin | ............... | H01L 27/3211 257/40 |
| 2010/0167435 A1* | 7/2010 | Bae | ............... | H01L 27/3246 438/23 |
| 2013/0240846 A1* | 9/2013 | Im | ............... | H01L 29/42384 257/40 |
| 2014/0014928 A1* | 1/2014 | Okumura | ............... | C08G 8/24 257/40 |
| 2014/0043307 A1* | 2/2014 | Choi | ............... | G09G 3/3283 345/205 |
| 2015/0154899 A1* | 6/2015 | Chang | ............... | G09G 3/3648 345/76 |
| 2016/0233459 A1* | 8/2016 | Tanaka | ............... | H01L 51/5296 |
| 2018/0069190 A1* | 3/2018 | Kim | ............... | H01L 27/1108 |
| 2018/0301511 A1* | 10/2018 | Liao | ............... | H01L 51/506 |

FOREIGN PATENT DOCUMENTS

| | | |
|---|---|---|
| CN | 104678667 A | 6/2015 |
| CN | 107369651 A | 11/2017 |
| EP | 1 659 647 A1 | 5/2006 |
| WO | 2006/061000 A2 | 6/2006 |
| WO | 2011/139006 A1 | 11/2011 |

OTHER PUBLICATIONS

Raffaella Capelli et al., 'Organic light-emitting transistors with an efficiency that outperforms the equivalent light-emitting diodes', Nature Materials, pp. 496-503, 2010. (Year: 2010).*
Office Action dated Oct. 9, 2019, issued in counterpart CN application No. 201711320689.6, with English translation. (19 pages).
International Search Report dated Feb. 20, 2019, issued in counterpart application No. PCT/CN2018/116391. (9 pages).
Office Action dated Mar. 19, 2020, issued in counterpart CN Application No. 201711320689.6, with English translation (18 pages).
Extended (Supplementary) European Search Report dated Aug. 27, 2021, issued in counterpart EP application No. 18889820.9. (8 pages).

* cited by examiner

ORGANIC LUMINESCENT SUBSTRATE, PREPARATION METHOD THEREOF, DISPLAY APPARATUS, AND DISPLAY DRIVING METHOD

CROSS-REFERENCE TO RELATED APPLICATIONS

This application claims benefit of the filing date of Chinese Patent Application No. 201711320689.6 filed on Dec. 12, 2017, the disclosure of which is hereby incorporated in its entirety by reference.

TECHNICAL FIELD

The present disclosure relates to display technology, and particularly to an organic luminescent substrate, a preparation method thereof, a display apparatus, and a display driving method.

BACKGROUND

The Field Effect Transistor (FET) is widely regarded by researchers because of its low cost, compatibility with flexible substrates and wide source of materials. Furthermore, the Organic Luminescent Transistor (OLET) combines the driving function of the FET and the luminescence function of Organic Luminescent Diode (OLED). The Organic Luminescent Transistor (OLET) possesses electroluminescence characteristics and has excellent application prospect in the field of display technology.

BRIEF SUMMARY

One example of the present disclosure provides an organic luminescent substrate. The organic luminescent substrate may include a first organic luminescent field effect transistor and a second organic luminescent field effect transistor. The first organic luminescent field effect transistor may include a first gate electrode, a first electrode, a second electrode, and a first active luminescent layer. The second organic luminescent field effect transistor may include a second gate electrode, a third electrode, a fourth electrode, and a second active luminescent layer. One of the first organic luminescent field effect transistor and the second organic luminescent field effect transistor is an N-type transistor and the other one is a P-type transistor. The first gate electrode is coupled to the second gate electrode.

Optionally, the second electrode is coupled to the fourth electrode, the first electrode and the second electrode are both coupled to the first active luminescent layer, and the third electrode and the fourth electrode are both coupled to the second active luminescent layer.

Optionally, the first active luminescent layer comprises a first organic luminescent semiconductor material; the second active luminescent layer comprises a second organic luminescent semiconductor material; one of the first organic luminescent semiconductor material and the second organic luminescent semiconductor material is an N type organic luminescent semiconductor material, and the other one is a P type organic luminescent semiconductor material.

Optionally, the first active luminescent layer comprises a first active layer and a first luminescent layer on a side of the first active layer; the second active luminescent layer comprises a second active layer and a second luminescent layer on a side of the second active layer; and the first active layer and the second active layer are in a same layer, and the first luminescent layer and the second luminescent layer are in a same layer.

Optionally, an orthographic projection of the first luminescent layer on a plane where the first active layer is located covers a partial region of the first active layer, the first electrode is coupled to a region on a side of the first active layer opposite from the base substrate and not covered by the first luminescent layer, and an orthographic projection of the first electrode on the plane where the first active layer is located does not overlap an orthographic projection of the first luminescent layer on the plane where the first active layer is located. An orthographic projection of the second luminescent layer on a plane where the second active layer is covers a partial region of the second active layer, the third electrode is coupled to a region on a side of the second active layer opposite from the base substrate and not covered by the second luminescent layer, and an orthographic projection of the third electrode on the plane where the second active layer is does not overlap the orthographic projection of second luminescent layer on the plane where the second active layer is.

Optionally, an orthographic projection of the second electrode on a plane where the first active luminescent layer is located does not overlap the first active luminescent layer. An orthographic projection of the fourth electrode on a plane where the second active luminescent layer is does not overlap the second active luminescent layer.

Optionally, the organic luminescent substrate further includes a transparent electrode. The transparent electrode couples the first active luminescent layer with the second electrode, and couples the second active luminescent layer with the fourth electrode.

Optionally, the first active luminescent layer and the second active luminescent layer are configured to emit light of different colors in a conductive state.

Optionally, the first electrode and the second electrode each have a comb shape comprising a comb tooth portion, an orthographic projection of the comb tooth portion of the first electrode on a plane where the first gate electrode is and an orthographic projection of the comb tooth portion of the second electrode on the plane where the first gate electrode is are alternately disposed. The third electrode and the fourth electrode each have a comb shape comprising a comb tooth portion, an orthographic projection of the comb tooth portion of the third electrode on a plane where the second gate electrode is and an orthographic projection of the comb tooth portion of the fourth electrode on the plane where the second gate electrode is 1 are alternately disposed.

Optionally, the first electrode is electrically coupled to the third electrode.

Another example of the present disclosure provides a method of preparing an organic luminescent substrate. The method may include forming patterns of a first gate electrode and a second gate electrode on a base substrate, the first gate electrode and the second gate electrode being electrically coupled; forming a gate electrode insulating layer on a side of the first gate electrode and the second gate electrode opposite from the base substrate; forming patterns of the first active luminescent layer and the second active luminescent layer on a side of the gate electrode insulating layer opposite from the base substrate; and forming patterns of a first electrode, a second electrode, a third electrode, and a four-electrode on a side of the first active luminescent layer and the second active luminescent layer opposite from the base substrate.

Optionally, forming the patterns of the first active luminescent layer and the second active luminescent layer on the side of the gate electrode insulating layer opposite from the base substrate comprises forming patterns of a first active layer and a second active layer on the side of the gate electrode insulating layer opposite from the base substrate by one patterning process; performing N-type doping on one of the first active layer and the second active layer, and performing P-type doping on the other one thereof; and forming a pattern of the first luminescent layer on a side of the first active layer opposite from the base substrate and a pattern of the second luminescent layer on a side of the second active layer opposite from the base substrate.

Optionally, forming the patterns of the first active luminescent layer and the second active luminescent layer on the side of the gate electrode insulating layer opposite from the base substrate comprises forming patterns of a first active layer and a second active layer on a side of the gate electrode insulating layer opposite from the base substrate; performing N-type doping on one of the first active layer and the second active layer, performing P-type doping on the other one thereof; forming an interlayer insulating layer on a side of the first active layer and the second active layer opposite from the base substrate, forming a first through hole and a second through hole respectively in regions of the interlayer insulating layer corresponding to the first electrode and the third electrode formed subsequently; and forming a first electrode, a second electrode, a third electrode, and a fourth electrode on a side of the interlayer insulating layer opposite from the base substrate. The first electrode is coupled to the first active layer through the first through hole, the third electrode is coupled to the second active layer through the second through hole; an orthographic projection of the second electrode and the fourth electrode on a plane where the first active layer is does not overlap the orthographic projection of first luminescent layer and the second luminescent layer formed subsequently on the plane where the first active layer is, and the second electrode is electrically coupled to the fourth electrode.

Optionally, forming patterns of the first electrode, the second electrode, the third electrode, and the a four-electrode on the side of the first active luminescent layer and the second active luminescent layer opposite from the base substrate comprises forming a transparent electrode, the transparent electrode coupling the first active luminescent layer with the second electrode as well as coupling the second active luminescent layer with the fourth electrode.

Optionally, the method of preparing an organic luminescent substrate may further include forming a pixel defining layer on a side of the interlayer insulating layer opposite from the base substrate. A region of the pixel defining layer on the first active layer and a region of the pixel defining layer on the second active layer are provided with a third through hole and a fourth through hole respectively.

Optionally, the method of preparing an organic luminescent substrate may further include forming the first luminescent layer and the second luminescent layer respectively in the third through hole and the fourth through hole; and forming a transparent electrode on a side of the pixel defining layer opposite from the base substrate, the transparent electrode coupling the first luminescent layer with the second electrode as well as coupling the second luminescent layer with the fourth electrode.

Another example of the present disclosure is a display apparatus. The display apparatus may include the organic luminescent substrate according to one embodiment of the present disclosure.

Optionally, the display apparatus may further include a plurality of gate lines and a plurality of data lines, the plurality of the gate lines and the plurality of the data lines defining a plurality of display areas arranged in an array, and the organic luminescent substrate has a one-to-one correspondence with each of the plurality of the display areas, each of the plurality of the display areas comprising a first sub-pixel region and a second sub-pixel region, the first organic luminescent field effect transistor is located in the corresponding first sub-pixel region, and the second organic luminescent field effect transistor is located in the corresponding second sub-pixel region.

Optionally, the display apparatus may further include a switching transistor. The switching transistor has a one-to-one correspondence with the organic luminescent apparatus, a gate electrode of the switching transistor is coupled to a corresponding one of the plurality of the gate lines, a source of the switching transistor is coupled to a corresponding one of the plurality of the data lines, and a drain of the switching transistor is coupled to the first gate electrode and the second gate electrode of the corresponding organic luminescent apparatus.

Another example of the present disclosure is a display driving method of the display apparatus according to one embodiment of the present disclosure. The display driving method may include inputting scanning signals to each of the gate lines one by one according to a first scanning period. The first scanning period comprises a first half period and a second half period, each of the data lines provides a first type of data voltage in the first half period and a second type of data voltage in the second half period, one of the first type of data voltage and the second type of data voltage is a high level data voltage, and the other one is a low level data voltage.

Optionally, each complete picture includes a previous frame and a subsequent frame. The display driving method may include inputting scan signals to each of the gate lines one by one according to a second scan period during a time of displaying the previous frame, wherein the data lines each provide a first type of data voltage in each second scan period; inputting scan signals to each of the gate lines one by one according to the second scan period during a time of displaying the subsequent frame, wherein the data lines each provide a second type of data voltage in each second scan period; and one of the first type of data voltage and the second type of data voltage is a high level data voltage, and the other one thereof is a low level data voltage.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Figure 1:
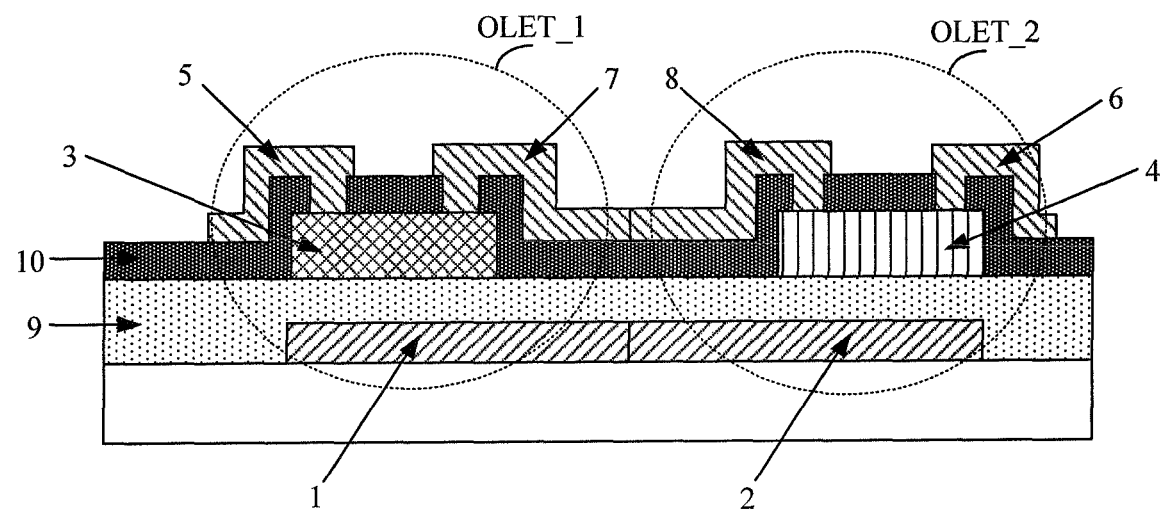
FIG. 1 is a schematic cross-sectional view of an organic luminescent substrate according to one embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-12b. When referring to the figures, like structures and elements shown throughout are indicated with like reference numerals.

Figure 2:
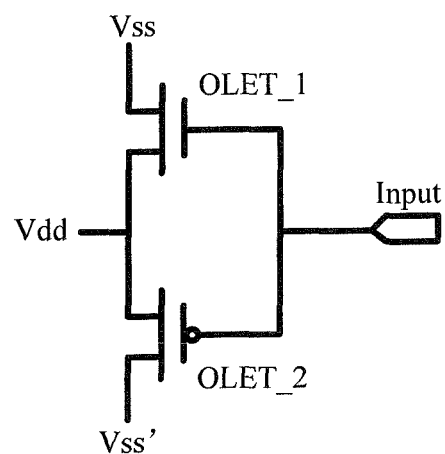
FIG. 2 is a schematic circuit diagram of an organic luminescent substrate according to one embodiment of the present disclosure.

FIG. 1 is a schematic cross-sectional view of an organic luminescent substrate according to one embodiment of the present disclosure. FIG. 2 is a schematic circuit diagram of an organic luminescent substrate according to one embodiment of the present disclosure. As shown in FIGS. 1 and 2, the organic luminescent substrate includes: a first organic luminescent field effect transistor OLET_1 and a second organic luminescent field effect transistor OLET_2. One of the first organic luminescent field effect transistor OLET_1 and the second organic luminescent field effect transistor OLET_2 is an N type Transistor, and the other one is a P-type transistor.

In some embodiments, the first organic luminescent field effect transistor OLET_1 includes: a first gate electrode 1, a first electrode 5, a second electrode 7, and a first active luminescent layer 3. The second organic luminescent field effect transistor OLET_2 includes: a second gate electrode 2, a third electrode 6, a fourth electrode 8, and a second active luminescent layer 4. The first gate electrode 1 is coupled to the second gate electrode 2, and the second electrode 7 is coupled to the fourth electrode 8.

In the embodiments, one of the first electrode 5 and the second electrode 7 in the first organic luminescent field effect transistor OLET_1 is the source of the transistor and the other one is the drain of the transistor. One of the third electrode 6 and the fourth electrode 8 in the second organic luminescent field effect transistor OLET_2 is the source of the transistor and the other one is the drain of the transistor.

In some embodiments, as shown in FIG. 1, the material of the first active luminescent layer 3 includes a first organic luminescent semiconductor material. The material of the second active luminescent layer 4 includes a second organic luminescent semiconductor material. One of the first organic luminescent semiconductor material and the second organic luminescent semiconductor material is an N type organic luminescent semiconductor material, and the other one is a P type organic luminescent semiconductor material.

It should be noted that the active luminescent layer in the present disclosure may be directly composed of an organic luminescent semiconductor material (shown in FIG. 1), or an independent organic luminescent layer and an independent active layer, or by doping in the organic luminescent layer to make the organic luminescent layer to have semiconductor characteristics. Of course, the active luminescent layer may further include a transport layer for improving efficiency of carrier (hole, electron) transfer. The technical solution of the present disclosure does not limit the specific structure of the active luminescent layer, but any structure capable of simultaneously providing the functions of the semiconductor layer and the luminescent layer can be used as the active luminescent layer in the present disclosure.

For convenience of description, the connection between the first gate electrode 1 and the second gate electrode 2 is referred to as a voltage input terminal of the organic luminescent apparatus. When a voltage is input to the input terminal of the voltage input terminal, the input voltage is simultaneously transmitted to the first gate electrode 1 and the second gate electrode 2.

In the present disclosure, the voltage input by the voltage input terminal can be divided into two types: a high level voltage and a low level voltage. The high-level voltage refers to a voltage capable of turning on the N-type transistor in the organic luminescent substrate and turning off the P-type transistor, and the low-level voltage specifically refers to a voltage capable of turning on the P-type transistor and turning off the N-type transistor in the organic luminescent apparatus. The specific ranges of the values of the high-level voltage and the low-level voltage are determined by the voltages to which the first electrode 5, the second electrode 7 (the fourth electrode 8), and the third electrode 6 are connected.

In the organic luminescent substrate provided by embodiments of the present disclosure, when the voltage input terminal inputs a high-level voltage, the N-type transistor is turned on and the P-type transistor is turned off. When the voltage input terminal inputs a low-level voltage, the P-type transistor is turned on and the N-type transistor is turned off. It can be seen that, regardless of the high-level voltage or the low-level voltage input by the voltage input terminal, only one of the first organic luminescent field effect transistor OLET_1 and the second organic luminescent field effect transistor OLET_2 is turned on and emits light. The other one is turned off and does not emit light. Thus, the organic luminescent substrate provided by embodiments of the present disclosure can control two different organic luminescent field effect transistors to emit light respectively through one voltage input terminal, thereby simplifying circuit complexity.

In order to facilitate the understanding of the present disclosure by those skilled in the art, an exemplary description will be made by taking the first organic luminescent field effect transistor OLET_1 as an N-type transistor and the second organic luminescent field effect transistor OLET_2 as a P-type transistor as an example.

In some embodiments, in operation, the first electrode 5 is coupled to the first working voltage Vss, the second electrode 7 (fourth electrode 8) is coupled to the second working voltage Vdd, and the third electrode is coupled to the third working voltage Vss', wherein Vss>Vdd>Vss'. At this time, the first electrode 5 and the third electrode 6 are both sources, and the second electrode 7 and the fourth electrode 8 are both drains. Correspondingly, the high-level voltage refers to a voltage whose voltage value is greater than Vdd+Vth_N, and the low-level voltage refers to a voltage whose voltage value is less than Vdd+Vth_P. Vth_N is a threshold voltage of the first organic luminescent field effect transistor OLET_1, and the value thereof is generally positive. Vth_P is a threshold voltage of the second organic luminescent field effect transistor OLET_2, and the value thereof is generally negative. In practical applications, the specific values of Vss, Vdd, and Vss' can be adjusted based on threshold voltages and sub-threshold swing characteristics of the first organic luminescent field effect transistor OLET_1 and the second organic luminescent field effect transistor OLET_2.

When the voltage input terminal inputs a high-level voltage, the first organic luminescent field effect transistor OLET_1 emits light, and the second organic luminescent field effect transistor OLET_2 does not emit light. By adjusting the magnitude of the high-level voltage, the brightness of the first organic luminescent field effect transistor OLET_1 can be adjusted. When the voltage input terminal inputs a low-level voltage, the second organic luminescent field effect transistor OLET_2 emits light, and the first organic luminescent field effect transistor OLET_1 does not emit light. By adjusting the magnitude of the low-level voltage, the brightness of the second organic luminescent field effect transistor OLET_2 can be adjusted.

In some embodiments, the threshold voltages of the first organic luminescent field effect transistor OLET_1 and the second organic luminescent field effect transistor OLET_2 can also be accurately set, so that when the voltage input terminal inputs a certain voltage, the first organic luminescent field effect transistor OLET_1 and the second organic luminescent field effect transistor OLET_2 can emit light at exactly the same time.

In addition, that the first organic luminescent field effect transistor OLET_1 is an N-type transistor, the second organic luminescent field effect transistor OLET_2 is a P-type transistor, and Vss>Vdd>Vss' is only an exemplary situation, and the embodiments of the present disclosure are not limited to the above situation.

For example, in some embodiments, Vss=Vss'>Vdd, at which time the second electrode 7 and the third electrode 6 serve as sources, and the first electrode 5 and the fourth electrode 8 serve as drains. Other situations will not be described here.

In one embodiment, the first active luminescent layer 3 and the second active luminescent layer 4 emit different colors of light when in a conductive state, that is, the organic luminescent substrate can emit light of two different colors, thereby enhancing color gamut of organic luminescent apparatus.

In some embodiments, the shapes of the first electrode 5 and the second electrode 7 are both comb-shaped. The orthographic projection of the comb tooth portion 5a of the first electrode 5 and the orthographic projection of the comb tooth portion 7a of the second electrode 7 on the plane where the first gate electrode 1 is located are alternately placed. The shapes of the third electrode 6 and the fourth electrode 8 are both comb-shaped. The orthographic projection of the comb tooth portion of the third electrode 6 and the orthographic projection of the comb tooth portion 7a of the fourth electrode 8 on the plane where the second gate electrode 2 is located are alternately placed.

Figure 3:
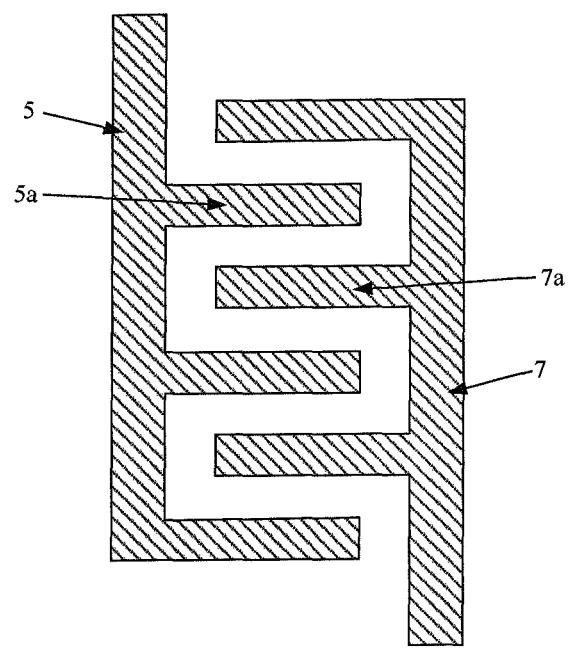
FIG. 3 is a top view of the first electrode and the second electrode according to one embodiment of the present disclosure.

FIG. 3 is a top view of the first electrode and the second electrode in one embodiment of the present disclosure. As shown in FIG. 3, by designing the first electrode 5 and the second electrode 7 to be comb-like, and the comb-tooth portions 5a, 7a of the two electrodes are alternately arranged. As such, the width of the channel region can be effectively increased. In the case where the length of the channel region is constant and the width of the channel region is increased, the aspect ratio of the channel region is also increased. Accordingly, corresponding to the same gate-source voltage, the channel current in the channel region (ie, driving current) increases. At this time, the brightness of the first organic luminescent field effect transistor OLET_1 is increased.

It can be seen from the above that by designing the first electrode 5, the second electrode 7, the third electrode 6, and the fourth electrode 8 into a comb shape, the channel current in the organic luminescent field effect transistor can be effectively increased, and the display brightness can be improved.

In some embodiments, the first electrode 5 and the second electrode 7 are coupled to the surface of the first active luminescent layer 3 opposite from the substrate by a through hole respectively on the interlayer insulating layer 10. The third electrode 6 and the fourth electrode 8 are coupled to the surface of the second active luminescent layer 4 opposite from the substrate by a through hole respectively on the interlayer insulating layer 10. In one embodiment, the interlayer insulating layer 10 is made of a transparent insulating material. Of course, in the present disclosure, there are many different ways that the first/second/third/fourth electrodes are connected to the corresponding active luminescent layer. In some embodiments, the first electrode 5 and the second electrode 7 may also directly connect to the first active luminescent layer 3. The third electrode 6 and the fourth electrode 8 can also be directly connected to the surface of the second active luminescent layer 4 opposite from the substrate.

Figure 4:
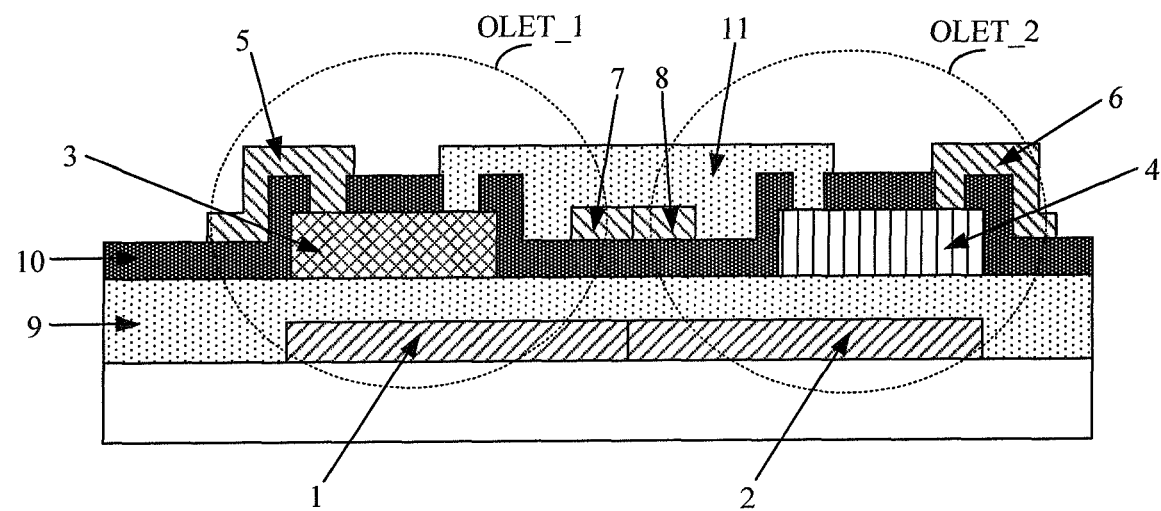
FIG. 4 is a schematic cross-sectional view of an organic luminescent substrate according to one embodiment of the present disclosure.

FIG. 4 is a schematic cross-sectional view of an organic luminescent substrate according to one embodiment of the present disclosure. As shown in FIG. 4, unlike the above-described organic luminescent substrate shown in FIG. 1, the orthographic projections of the second electrode 7 and the fourth electrode 8 on the plane of the first active luminescent layer 3 (or second active luminescent layer 4) in the organic luminescent substrate shown in FIG. 4 do not overlap the first active luminescent layer 3 and the second active luminescent layer 4. The second electrode 7 and the fourth electrode 8 are connected to the corresponding first active luminescent layer 3 and the second active luminescent layer 4 respectively through the transparent electrode 11. As such, the second electrode 7 and the fourth electrode 8 do not block the first active luminescent layer 3, which can effectively reduce the light transmission loss.

Figure 5:
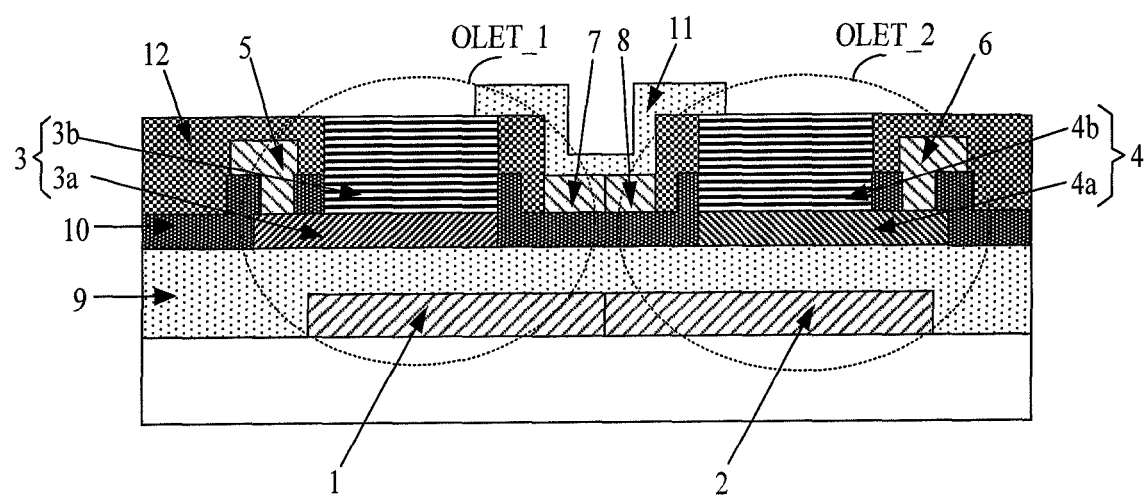
FIG. 5 is a schematic cross-sectional view of an organic luminescent substrate according to one embodiment of the present disclosure.

FIG. 5 is a schematic cross-sectional view of an organic luminescent substrate according to one embodiment of the present disclosure. As shown in FIG. 5, unlike the organic luminescent substrate shown in FIG. 1 and FIG. 4, the first active luminescent layer 3 in the organic luminescent substrate shown in FIG. 5 includes an independent first active layer 3a and an independent first luminescent layer 3b. The second active luminescent layer 4 includes: an independent second active layer 4a and an independent second luminescent layer 4b. The first active layer 3a is located on a side of the first luminescent layer 3b facing the base substrate, and the second active layer 4a is located on a side of the second luminescent layer 4b facing the base substrate. The formation regions of the first luminescent layer 3b and the second luminescent layer 4b are defined by the pixel defining layer 12.

In some embodiments, the orthographic projection of the first luminescent layer 3b on the plane where the first active layer 3a is located covers a portion of the first active layer 3a. The first electrode 5 is coupled to a region of the first active layer 3a opposite from the base substrate and not covered by the first luminescent layer 3b, and the orthographic projection of the first electrode 5 on the plane where the first luminescent layer 3b is located does not overlap the first luminescent layer 3b. That is, the first electrode 5 does not overlap the first luminescent layer 3b, as shown in FIG. 5.

The orthographic projection of the second luminescent layer 4b on the plane where the second active layer 4a is located covers a partial region of the second active layer 4a. The third electrode 6 is connected to a region of the second active layer 4a opposite from the substrate and not covered by the second luminescent layer 4b, and the orthographic projection of the third electrode 6 on the plane where the second luminescent layer 4b is located does not overlap the second luminescent layer 4b. That is, the third electrode 6 does not overlap the second luminescent layer 3b, as shown in FIG. 5.

That is, in the organic luminescent substrate shown in FIG. 5, neither the first electrode 5 nor the third electrode 6 obstructs the corresponding organic luminescent layer, and the light transmission loss can be effectively reduced.

In some embodiments, in the organic luminescent substrate shown in FIG. 5, the orthographic projections of the second electrode 7 and the fourth electrode 8 on the plane where the first luminescent layer 3b (the second luminescent layer 4b) is located do not overlap the first luminescent layer 3b and the second luminescent layer 4b. The second electrode 7 and the fourth electrode 8 are electrically connected to the corresponding first and second luminescent layers 3b and 4b through the transparent electrode 11. As such, since the first electrode 5, the second electrode 7, the third electrode 6, and the fourth electrode 8 do not block the corresponding organic luminescent layer, the light transmission loss can be further reduced.

In some embodiments, that the first active luminescent layer 3 shown in FIG. 5 comprising an independent first active layer 3a and an independent first luminescent layer 3b, and the second active luminescent layer 4 comprising an independent second active layer 4a and an independent second luminescent layer 4b is also applicable to the organic luminescent substrate shown in FIGS. 1 and 4.

The specific structure of the first active luminescent layer 3 and the second active luminescent layer 4, the relative positional relationship between the first electrode 5, the second electrode 7 and the first active luminescent layer 3, the relative positional relationship between the third electrode 6, the fourth electrode 8 and the second active luminescent layer 4 are not limited. In the present disclosure, the first electrode 5 and the second electrode 7 are both electrically coupled to the first active luminescent layer 3, and the third electrode 6 and the fourth electrode 8 are both electrically coupled to the second active luminescent layer 4.

It should be noted that, in the organic luminescent substrate shown in FIG. 1, FIG. 4 and FIG. 5, the case where the first electrode 5 and the third electrode 6 are not coupled only serves as a schematic illustration, which does not limit the scope of the embodiments of the present disclosure. In the embodiments of the present disclosure, the first electrode 5 and the third electrode 6 may be selected to be connected or not connected according to actual needs, and all of them belong to the protection scope of the present disclosure.

Wherein, when the first electrode 5 and the third electrode 6 are not connected, different voltages may be input to the first electrode 5 and the third electrode 6 respectively to control the magnitudes of the drive currents of the first organic luminescent field effect transistor OLET_1 and the second organic luminescent field effect transistor OLET_2. However, at this time, two signal traces are required for the first electrode 5 and the third electrode 6.

When the first electrode 5 and the third electrode 6 are connected (the corresponding drawing is not given in this case), the first organic luminescent field effect transistor OLET_1 and the second organic luminescent field effect transistor OLET_2 are controlled only by the voltage inputted from the voltage input terminal. However, at this time, it is necessary to arrange only one signal trace for the first electrode 5 and the third electrode 6, which saves wiring space and is advantageous for high resolution of the display substrate.

Figure 6:
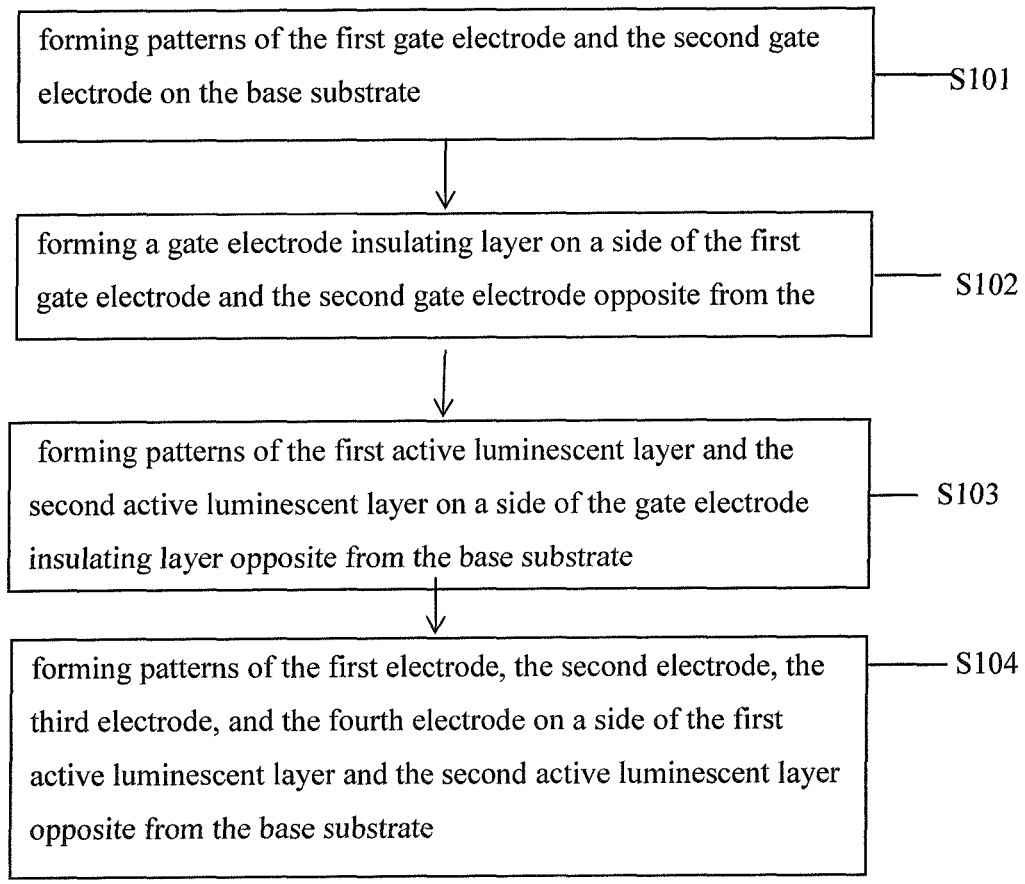
FIG. 6 is a flow chart of a method of preparing an organic luminescent substrate according to one embodiment of the present disclosure.
Figure 7A:
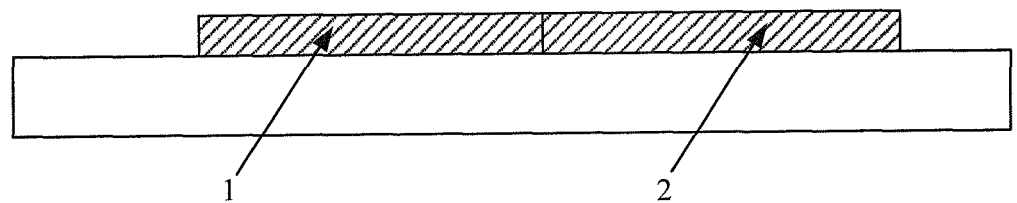
FIGS. 7a to 7c are schematic diagrams of intermediate structures of an organic luminescent substrate prepared by the preparation method according to one embodiment of the present disclosure.
Figure 7B:
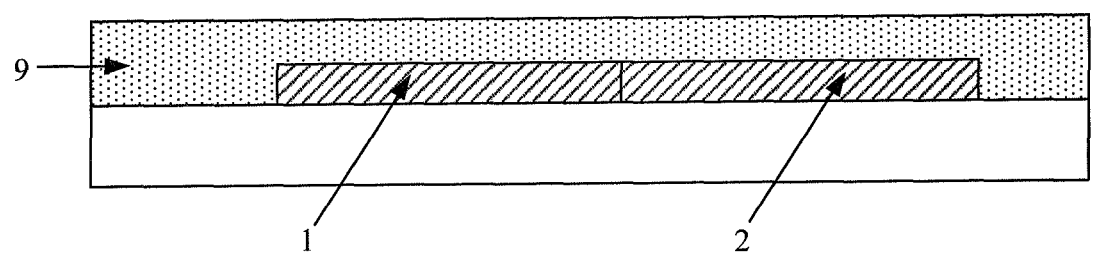
Figure 7C:
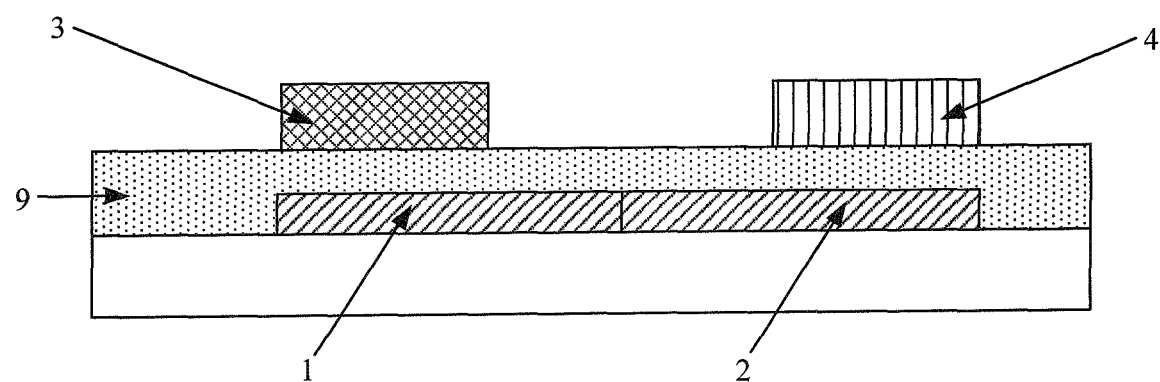

Another example of the present disclosure provides a method for preparing an organic luminescent apparatus. FIG. 6 is a flow chart for a method for preparing an organic luminescent substrate shown in FIG. 1 and FIG. 4. FIGS. 7a to 7c are schematic diagrams showing the intermediate structures of the organic luminescent substrate prepared by the preparation method shown in FIG. 6. As shown in FIG. 6 to FIG. 7c, the method includes the following steps S101-S104.

Step S101 includes forming patterns of the first gate electrode and the second gate electrode on the base substrate.

In one embodiment, as shown in FIG. 7a, a thin film of a metal conductive material is formed on the base substrate, and then the thin film of the metal conductive material is subjected to a patterning process to obtain a pattern of the first gate electrode 1 and the second gate electrode 2. The first gate electrode 1 and the second gate electrode 2 are connected.

In the present disclosure, the thin film is usually formed by various methods such as deposition, coating, sputtering, etc., and the specific method can be selected according to actual needs. The patterning process specifically refers to a process including photoresist coating, exposure, development, thin film etching, photoresist stripping, and the like.

Step S102 includes forming a gate electrode insulating layer on a side of the first gate electrode and the second gate electrode opposite from the substrate.

As shown in FIG. 7b, a film of an insulating material is formed on the surface of the base substrate prepared in step S101 to obtain a gate electrode insulating layer 9.

Step S103 includes forming patterns of the first active luminescent layer and the second active luminescent layer on a side of the gate electrode insulating layer opposite from the base substrate.

In some embodiments, as shown in FIG. 7c, the material of the first active luminescent layer 3 includes a first organic luminescent semiconductor material, and the material of the second active luminescent layer 4 includes a second organic luminescent semiconductor material. One of the first organic luminescent semiconductor material and the second organic luminescent semiconductor material is an N-type organic luminescent semiconductor material, and the other is a P-type organic luminescent semiconductor material.

In some embodiments, step S103 specifically includes the following steps S1031 to S1035.

Step S1031 includes forming a pattern of the first active luminescent layer 3 on a side of the gate electrode insulating layer opposite from the base substrate by one patterning process.

In one embodiment, first, a first organic luminescent semiconductor material film is formed on a side of the gate electrode insulating layer 9 opposite from the base substrate. Then, the first organic luminescent semiconductor material film is patterned to obtain a pattern of the first active luminescent layer.

Step S1032 includes forming a pattern of the second active luminescent layer on a side of the gate electrode insulating layer opposite from the base substrate by one patterning process.

In one embodiment, first, a second organic luminescent semiconductor material film is formed on a side of the gate electrode insulating layer 9 opposite from the base substrate. Then, the second organic luminescent semiconductor material film is patterned to obtain a pattern of the second active luminescent layer 4.

In one embodiment, the first active luminescent layer 3 includes: a first active layer and a first luminescent layer on a side of the first active layer opposite from the base substrate. The second active luminescent layer 4 includes: a second active layer and a second luminescent layer on a side of the second active layer opposite from the base substrate. The first active layer and the second active layer are disposed in the same layer, and the first luminescent layer and the second luminescent layer are disposed in the same layer (the corresponding drawings are not given in this case).

In one embodiment, step S103 specifically includes:

Step S1033 includes forming patterns of the first active layer and the second active layer on a side of the gate electrode insulating layer opposite from the base substrate by one patterning process.

In one embodiment, first, a thin film of active material is formed on the surface of the gate electrode insulating layer, such as a film of polysilicon material. In one embodiment, first, an amorphous silicon (a-Si) film is formed on the surface of the gate electrode insulating layer, and then the amorphous silicon film is processed by a laser annealing process to be converted into a polysilicon (p-Si) film, thereby obtaining an active material film. Then, a patterning process is performed on the active material film to obtain patterns of the first active layer and the second active layer.

Step S1034 includes performing N-type doping on one of the first active layer and the second active layer, and performing P-type doping on the other one of the first active layer and the second active layer.

In this step, the first active layer and the second active layer are respectively doped differently, one of which is P-doped and the other is N-doped to obtain a P-type semiconductor and an N-type semiconductor, respectively.

Step S1035 involves forming a pattern of the first luminescent layer on a side of the first active layer opposite from the base substrate, and forming a pattern of the second luminescent layer on a side of the second active layer opposite from the base substrate. In one embodiment, the first luminescent layer and the second luminescent layer are disposed in the same layer.

In one embodiment, the first active luminescent layer 3 and the second active luminescent layer 4 emit different colors of light when in a conductive state, thereby enhancing the display gamut of the organic luminescent apparatus.

Step S104 includes forming patterns of the first electrode, the second electrode, the third electrode, and the fourth electrode on a side of the first active luminescent layer and the second active luminescent layer opposite from the base substrate.

In one embodiment, the second electrode 7 is directly coupled to the first active luminescent layer 3 and the fourth electrode 8 is directly coupled to the second active luminescent layer 4, as shown in FIG. 1. First, a film of an insulating material is formed on the surface of the substrate prepared in step S104, and then a patterning process is performed on the film of the insulating layer material to obtain a pattern of the interlayer insulating layer 10, wherein the interlayer insulating layer 10 is formed with first and second through holes. Then, a thin film of a metal material is formed on the side of the interlayer insulating layer 10 opposite from the base substrate, and the metal material film is subjected to a patterning process to obtain patterns of the first electrode 5, the second electrode 7, and the third electrode 6, and the fourth electrode 8. The first electrode 5 and the second electrode 7 are both coupled to the first active luminescent layer 3, and the third electrode 6 and the fourth electrode 8 are both coupled to the second active luminescent layer 4.

In one embodiment, as shown in FIG. 4, the orthographic projection of the second electrode 7 and the fourth electrode 8 on the plane where the first active luminescent layer 3 (the second active luminescent layer 4) is located does not overlap the first active luminescent layer 3 and the second active luminescent layer 4. The second electrode 7 and the fourth electrode 8 are coupled to the corresponding first active luminescent layer 3 and the second active luminescent layer 4 through the transparent electrode 11. In this step, after patterning the first electrode 5, the second electrode 7, the third electrode 6, and the fourth electrode 8 by an one-time patterning process, a transparent conductive film needs to be further formed, and then a patterning process is performed on the transparent conductive film to obtain a pattern of transparent electrode 11.

In one embodiment, the shape of the first electrode 5 and the second electrode 7 are both comb-shaped, and the orthographic projection of comb tooth portion of the first electrode 5 on the plane of the first gate electrode 1 and the orthographic projection of the comb tooth portion of the second electrode 7 on the plane of the first gate electrode 1 are alternately disposed. The shape of the third electrode 6 and the fourth electrode 8 are both comb-shaped, and the orthographic projection of comb tooth portion of the third electrode 6 on the plane of the second gate electrode 2 and the orthographic projection of the comb tooth portion of the fourth electrode 8 on the plane of the second gate electrode 2 are alternately disposed. By designing the first electrode 5, the second electrode 7, the third electrode 6, and the fourth electrode 8 to be comb-like, the channel current in the organic luminescent field effect transistor can be effectively increased, and the display brightness can be improved.

It should be noted that, in this embodiment, the first electrode 5 and the third electrode 6 may be connected or not connected according to actual needs.

Figure 8:
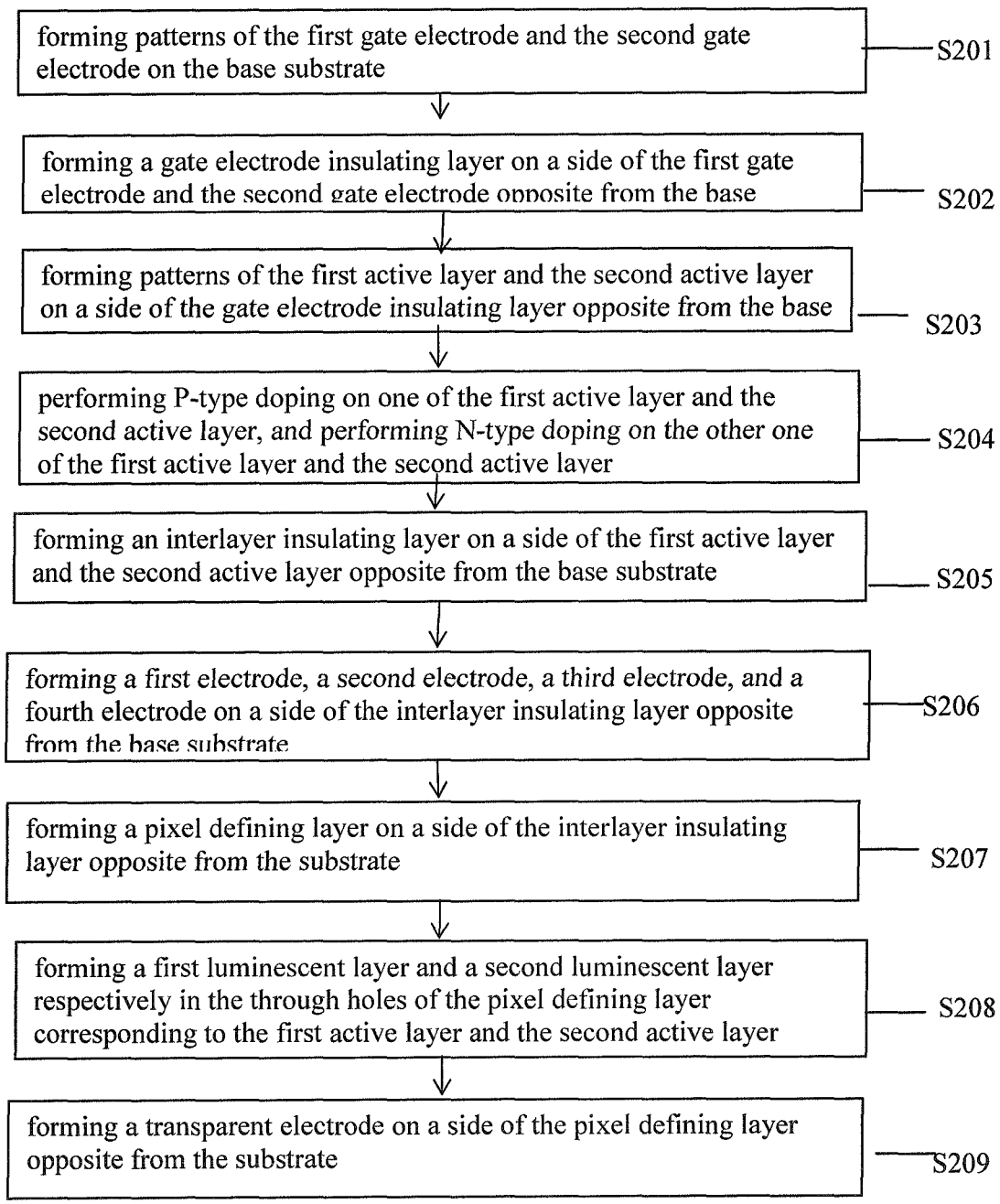
FIG. 8 is a flow chart of a method of preparing an organic luminescent substrate according to one embodiment of the present disclosure.
Figure 9A:
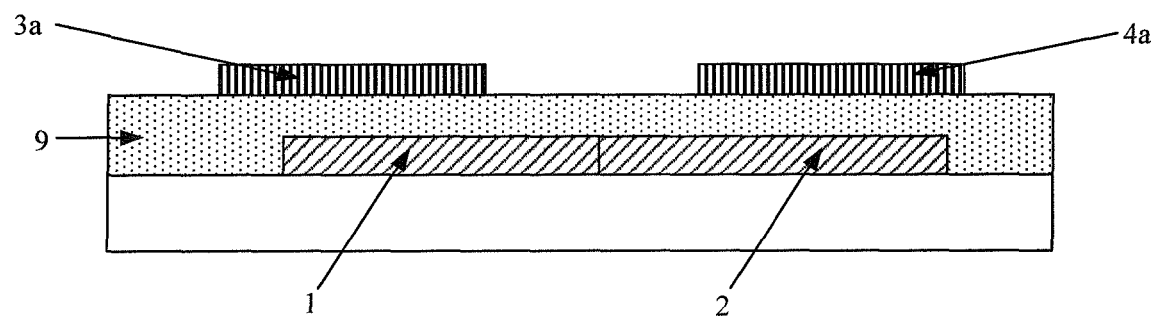
FIGS. 9a to 9f are schematic diagrams of intermediate structures of an organic luminescent substrate prepared by the preparation method according to one embodiment of the present disclosure.
Figure 9B:
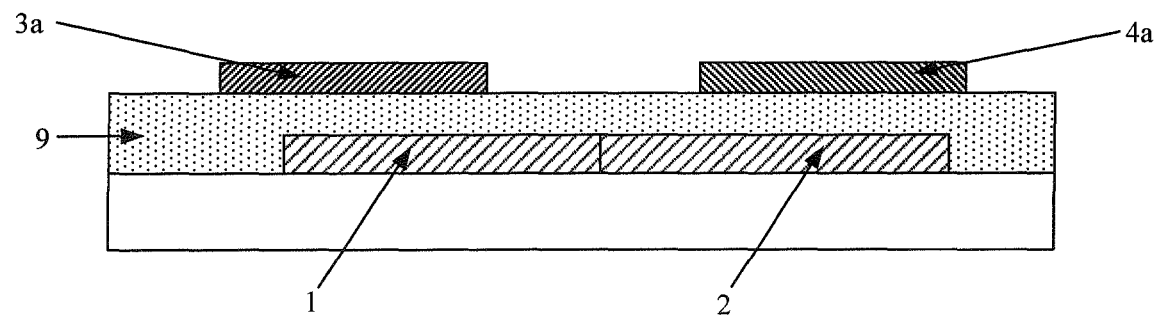
Figure 9C:
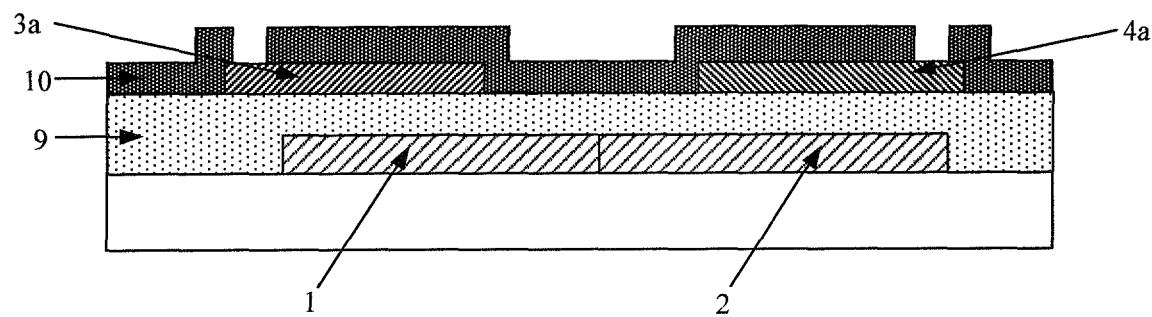
Figure 9D:
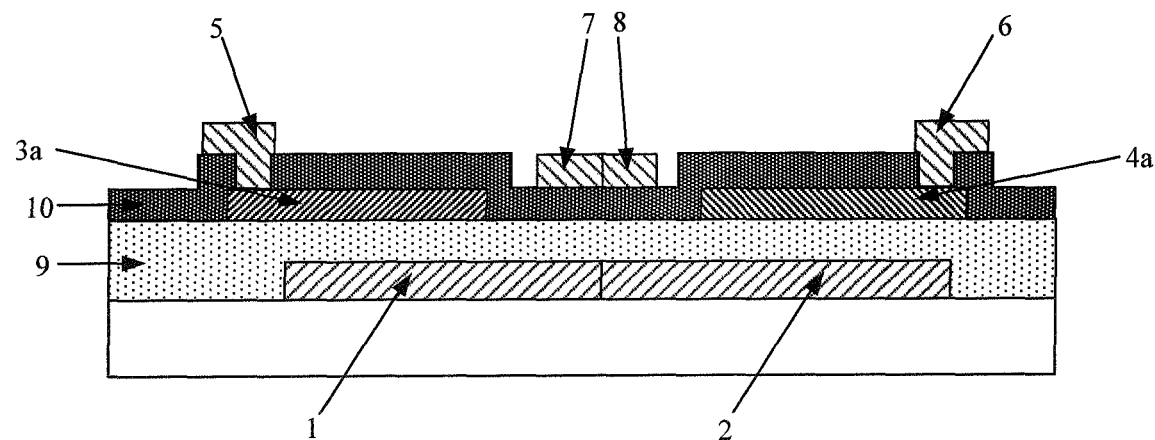
Figure 9E:
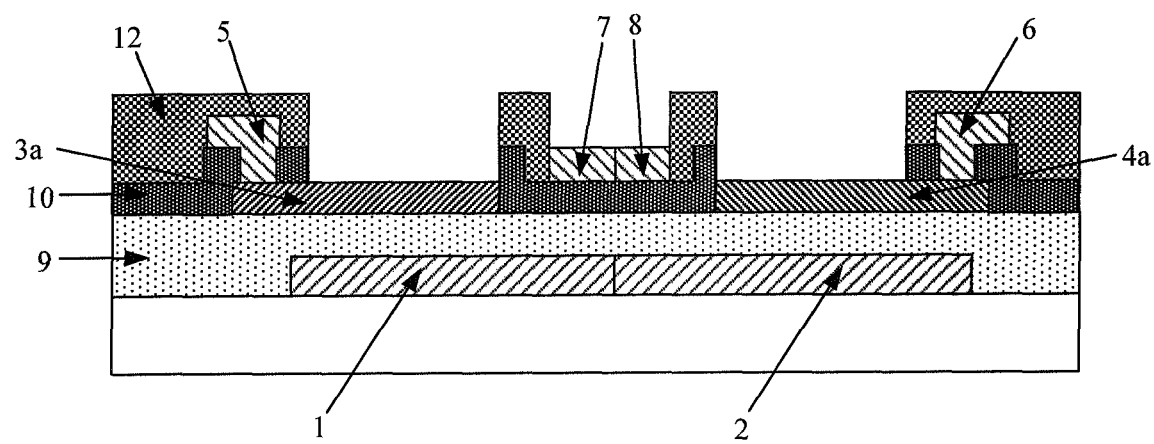
Figure 9F:
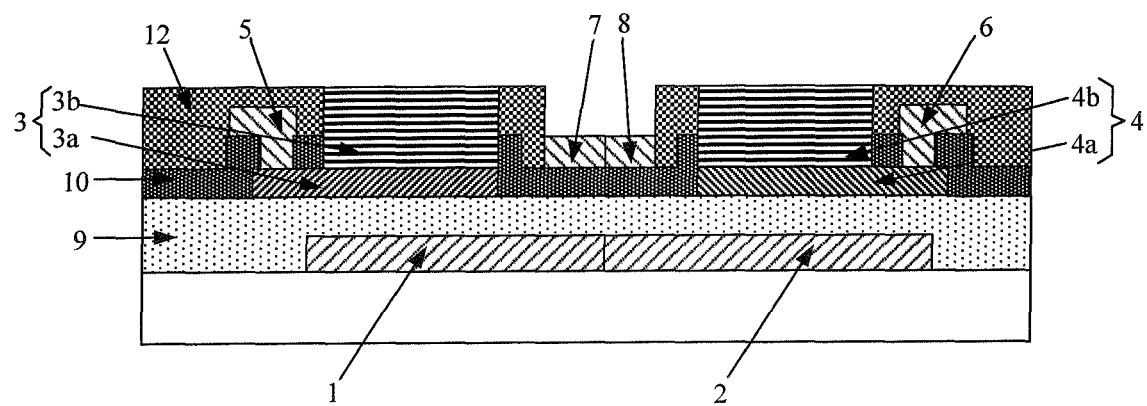

FIG. 8 is a flow chart of a method for preparing an organic luminescent substrate shown in FIG. 5, and FIGS. 9a to 9f are schematic diagrams showing intermediate structures of the organic luminescent substrate prepared by the preparation method shown in FIG. 8. As shown in FIGS. 8 to 9f, the preparation method includes the following:

Step S201 includes forming patterns of the first gate electrode and the second gate electrode on the base substrate.

Step S202 includes forming a gate electrode insulating layer on a side of the first gate electrode and the second gate electrode opposite from the base substrate.

For the detailed description of step S201 and step S202, the foregoing description of step S101 and step S102 can be consulted, and details are not described herein again.

Step S203 includes forming patterns of the first active layer and the second active layer on a side of the gate electrode insulating layer opposite from the base substrate.

In one embodiment, as shown in FIG. 9a, first, a thin film of active material, such as a film of polysilicon material, is formed on the surface of the gate electrode insulating layer 9. Specifically, an amorphous silicon (a-Si) film is formed on the surface of the gate electrode insulating layer 9, and then the amorphous silicon film is processed by a laser annealing process to be converted into a polysilicon (p-Si) film, thereby obtaining an active material film. Next, a patterning process is performed on the active material film to obtain patterns of the first active layer 3a and the second active layer 4a.

Step S204 includes performing P-type doping on one of the first active layer and the second active layer, and performing N-type doping on the other one of the first active layer and the second active layer.

As shown in FIG. 9b, the first active layer 3a and the second active layer 4a are respectively doped differently, one of which is P-doped and the other is N-doped to obtain a P-type semiconductor and an N-type semiconductor respectively.

Step S205 includes forming an interlayer insulating layer on a side of the first active layer and the second active layer opposite from the base substrate. As shown in FIG. 9c, a film of an insulating material is formed on the surface of the substrate prepared in step S204, and then a patterning process is performed on the film of the insulating layer material to obtain a pattern of the interlayer insulating layer 10. The interlayer insulating layer 10 is formed with first and second through holes corresponding to regions where the first electrode 5 and the third electrode 6 are to be formed later.

Step S206 includes forming a first electrode, a second electrode, a third electrode, and a fourth electrode on a side of the interlayer insulating layer opposite from the base substrate.

As shown in FIG. 9d, a thin film of a metal material is formed on a side of the interlayer insulating layer 10 opposite from the substrate, and a patterning process is performed on the film of the metal material to obtain patterns of a first electrode 5, a second electrode 7, a third electrode 6 and a fourth electrode 8.

The first electrode 5 and the third electrode 6 are respectively coupled to the corresponding first active layer 3a and the second active layer 4a through a first and a second through hole. The orthographic projection of the second electrode 7 and the fourth electrode 8 on the plane where the first luminescent layer 3b (or the second luminescent layers 4b) are located does not overlap the first luminescent layer 3b and the second luminescent layer 4b subsequently formed.

Step S207 includes forming a pixel defining layer on a side of the interlayer insulating layer opposite from the substrate.

As shown in FIG. 9e, a film of a pixel defining material is formed on a side of the interlayer insulating layer 10 opposite from the substrate, and the film of the pixel defining material is patterned by a patterning process to obtain a pattern of the pixel defining layer 12. Third and fourth through holes are formed on the pixel defining layer 12 at positions corresponding to the first luminescent layer 3b and the second luminescent layer 4b, and the third and fourth through holes are penetrated to the side of the first active layer 3a and the second active layer 4a opposite from the base substrate through the over-etching process. Through holes are also provided on the regions of the pixel defining layer 12 corresponding to the second electrode 7 and the fourth electrode 8.

Step 208 includes forming a first luminescent layer and a second luminescent layer respectively in the third and fourth through holes of the pixel defining layer corresponding to the first active layer and the second active layer respectively.

As shown in FIG. 9f, a process of forming a luminescent layer by inkjet printing is taken as an example, and a first luminescent material solution is sprayed into the third through hole in the pixel defining layer 12 corresponding to the first active layer 3a, and then the first luminescent material solution is subjected to a drying treatment to obtain a first luminescent layer 3b. A second luminescent material solution is sprayed into the fourth through hole in the pixel defining layer 12 corresponding to the second active layer 4a, and then the second luminescent material solution is subjected to a drying treatment to obtain a second luminescent layer 4b.

Of course, the first luminescent layer 3b and the second luminescent layer 4b may also be formed by evaporation deposition, and the specific process is not described in detail herein.

Step S209 includes forming a transparent electrode on a side of the pixel defining layer opposite from the substrate.

Referring to FIG. 5, a transparent conductive film is formed on a side of the pixel defining layer 12 opposite from the substrate, and a patterning process is performed on the transparent conductive film to obtain a pattern of the transparent electrode 11. The transparent electrode 11 is coupled to the second electrode 7 and the fourth electrode 8 by through holes and is coupled to the first luminescent layer 3b and the second luminescent layer 4b.

Figure 10:
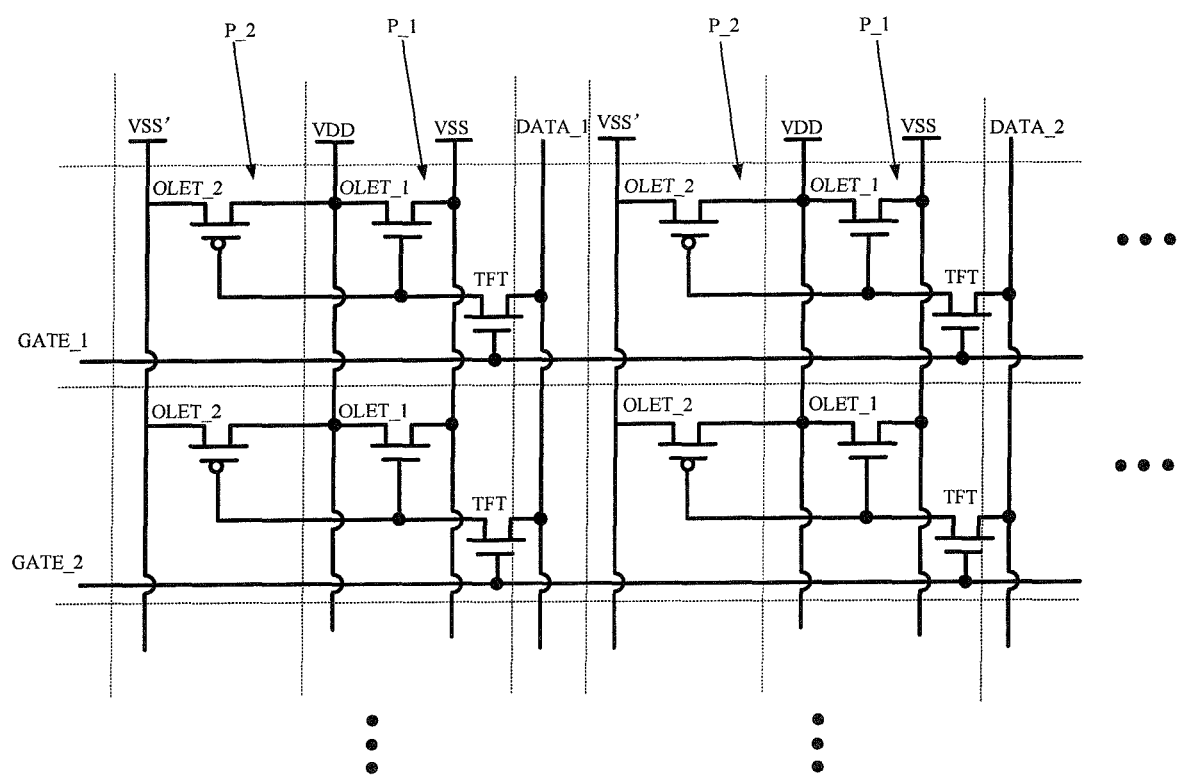
FIG. 10 is a schematic structural diagram of a circuit of a display apparatus according to one embodiment of the present disclosure.
Figure 11:
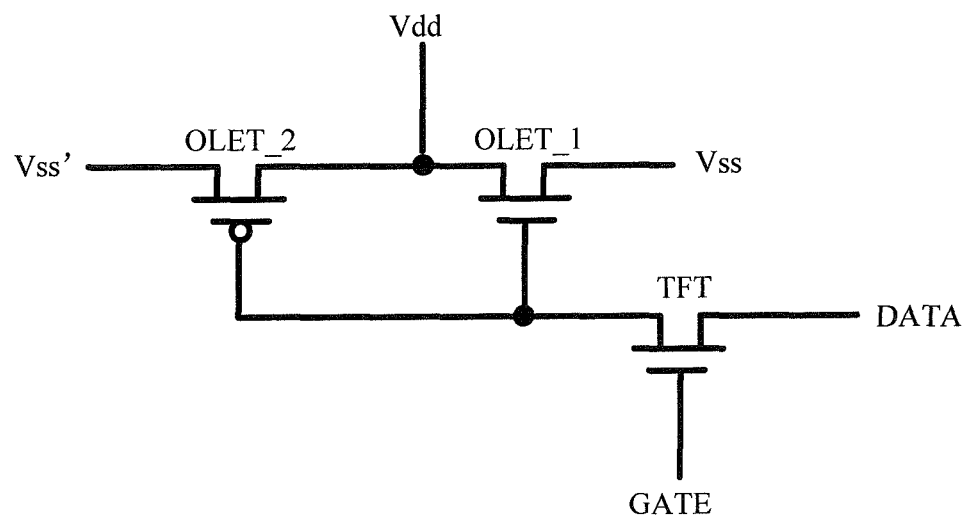
FIG. 11 is a schematic view of a structure of a circuit in a display area of FIG. 10.

FIG. 10 is a schematic structural diagram of a circuit of a display apparatus according to one embodiment of the present disclosure, and FIG. 11 is a schematic structural diagram of a circuit in a display area of FIG. 10. As shown in FIG. 10 and FIG. 11, the display apparatus includes an organic luminescent substrate. The organic luminescent substrate is the organic luminescent substrate provided according to one embodiment of the present disclosure. The detailed description of the organic luminescent substrate can be consulted with the content in the first embodiment, and the details thereof are not repeated herein.

In some embodiments, the display apparatus further includes: a plurality of gate lines GATE_1/GATE_2 . . . and a plurality of data lines DATA_1/DATA_2 . . . . The gate lines GATE_1/GATE_2 . . . and the data lines DATA_1/DATA_2 . . . are arranged to define a plurality of display areas in an array, and the organic luminescent apparatuses and the display areas are in one-to-one correspondence. The display area includes: a first sub-pixel area P_1 and a second sub-pixel area P_2, the first organic luminescent field effect transistor OLET_1 is located in the corresponding first sub-pixel area P_1, and the second organic luminescent field effect transistor OLET_2 is located in the corresponding second sub-pixel area P_2. In this embodiment, the first organic luminescent field effect transistor OLET_1 and the second organic luminescent field effect transistor OLET_2 in the adjacent columns can use the same data line to provide the data voltage. As such, the number of wires of the data lines in the display substrate can be reduced, which is advantageous for high resolution of the display substrate.

The display apparatus further includes a plurality of switching transistors TFT. The switching transistor TFTs are in one-to-one correspondence with the organic luminescent apparatuses. The gate electrode of the switching transistor TFT is connected to the corresponding gate line, the source of the switching transistor TFT is connected to the corresponding data line, and the drain of the switching transistor TFT is connected to the first gate electrode 1 and the second gate electrode 2 of the corresponding organic luminescent apparatuses.

In one embodiment, the operation of the display apparatus shown in FIG. 10 will be described in detail below with reference to the accompanying drawings. In the embodiment, the switching transistor TFT is an N-type transistor, the first organic luminescent field effect transistor OLET_1 is an N-type transistor, and the second organic luminescent field effect transistor OLET_2 is a P-type transistor. In the present disclosure, the high-level data voltage (referred to as V+) refers to a data voltage capable of turning on the N-type transistor and turning off the P-type transistor in the organic luminescent apparatus. The low-level data voltage (referred as V−) specifically refers to a data voltage capable of turning on the P-type transistor and turning off the N-type transistor in the organic luminescent apparatus.

In this embodiment, the first electrode 5 is connected to the first working voltage Vss, the second electrode 7 (the fourth electrode 8) is connected to the second working voltage Vdd, and the third electrode is connected to the third working voltage Vss', wherein Vss>Vdd>Vss'. The first electrode 5 and the third electrode 6 are both sources, and the second electrode 7 and the fourth electrode 8 are both drains. Correspondingly, the high level data voltage refers to a voltage whose voltage value is greater than Vdd+Vth_N, and the low level data voltage refers to a data voltage whose voltage value is less than Vdd+Vth_P, wherein Vth_N is the threshold voltage of the first organic luminescent field effect transistor OLET_1, and Vth_P is the threshold voltage of the second organic luminescent field effect transistor OLET_2.

Figure 12A:
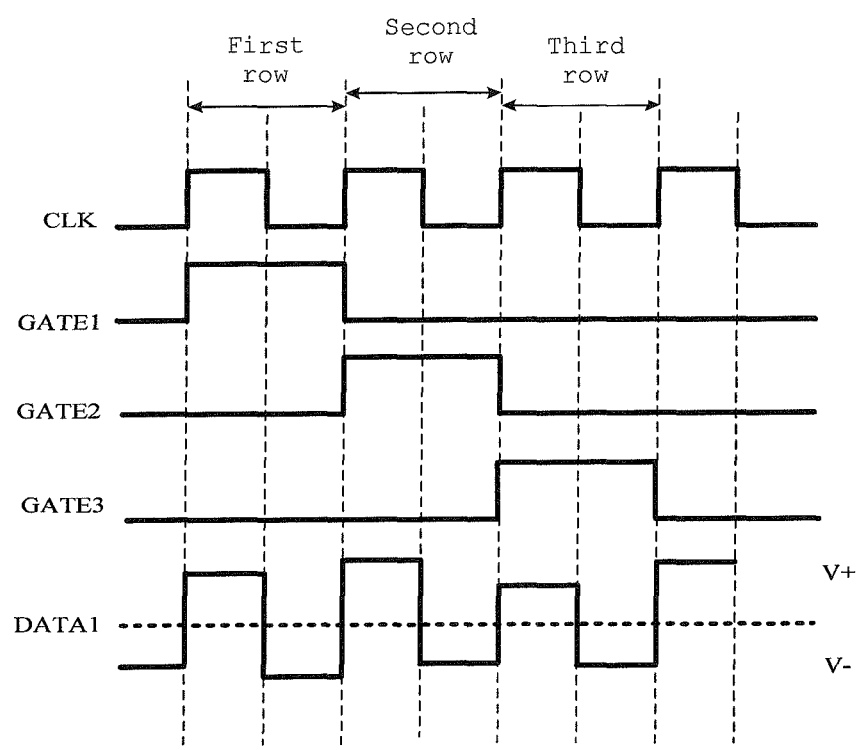
FIG. 12a is a schematic diagram of a driving sequence of the display apparatus according to one embodiment of the present disclosure.

FIG. 12a is a schematic diagram of a driving sequence of the display apparatus shown in FIG. 10. As shown in FIG. 12a, as an optional time-division driving scheme, scan signals are input to each gate electrode line one by one according to a first scan period. Each first scan period is divided into a first half period and a second half period. In the first half period, the data line provides a high-level data voltage, and in the second half of the cycle, the data line provides a low-level data voltage.

Wherein, in the case that the first scan period (scanning time per line) is equal to the clock signal period, the durations of the first half period and the second half period can be controlled by the duration of the high and low periods in the clock signal period.

Taking the first row gate line GATE_1 as an example, when a high level signal is input in the first row gate line GATE_1, the switching transistors TFTs in the display regions of the first row are turned on. In the first half period, a high-level data voltage is supplied in each of the data lines DATA_1/DATA_2, . . . so that the first organic luminescent field effect transistor OLET_1 in each of the first sub-pixel regions P_1 of the first row emits light. By controlling the magnitude of the high-level data voltage in each of the data lines DATA_1/DATA_2, the illumination brightness of each of the first organic luminescent field effect transistors OLET_1 located in the first row can be controlled. In the second half period, a low-level data voltage is supplied in each of the data lines DATA_1/DATA_2, . . . so that the second organic luminescent field effect transistor OLET_2 in each of the second sub-pixel regions P_2 of the first row emits light. By controlling the magnitude of the low-level data voltage in each data line DATA_1/DATA_2, the illumination brightness of each of the second organic luminescent field effect transistors OLET_2 located in the first row can be controlled.

Under the effect of vision persistence, the user will perceive that the first organic luminescent field effect transistors OLET_1 and the second organic luminescent field effect transistors OLET_2 in the first row simultaneously emit light.

Based on the same principle described above, the user will perceive a complete picture after the gate lines are scanned line by line.

Figure 12B:
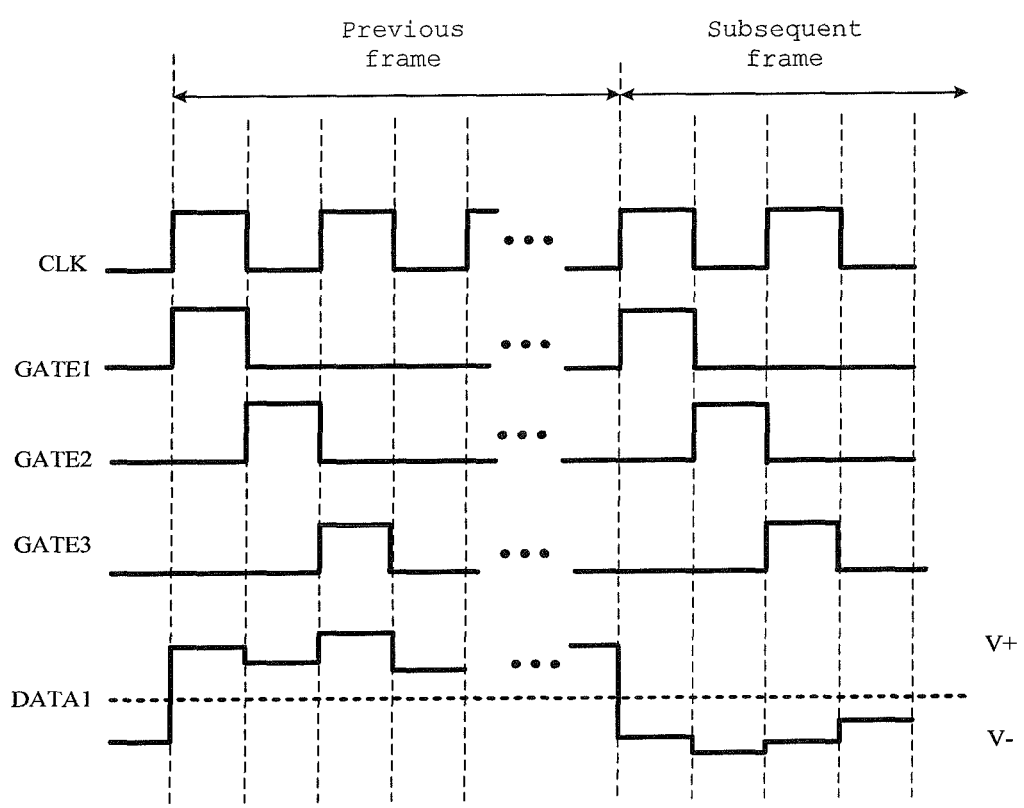
FIG. 12b is a schematic diagram of a driving sequence of the display apparatus according to one embodiment of the present disclosure.

FIG. 12b is another schematic diagram of driving timing of the display apparatus shown in FIG. 10. As shown in FIG. 12b, as another optional time division driving scheme, each complete picture includes: a previous frame and a subsequent frame. When the previous frame is displayed, a scanning signal is input to the respective gate line one by one according to a second scanning period, wherein the data line provides a high level data voltage in each of the second scan periods. When the subsequent frame is displayed, a scan signal is input to the respective gate line one by one according to the second scan period, wherein the data line provides the low level data voltage in each of the second scan periods.

In the driving scheme shown in FIG. 12b, the second scan period (scan time per line) is equal to half a clock period.

When the previous frame is displayed, the scan signals are input to the gate lines GATE_1/GATE_2 . . . one by one, and each of the data lines DATA_1/DATA_2 . . . provides a high-level data voltage, the first organic luminescent field effect transistors OLET_1 in the display substrate emits light line by line. By controlling the magnitude of the high-level data voltage in each of the data lines DATA_1/DATA_2, the luminescent brightness of each of the first organic luminescent field effect transistors OLET_1 can be controlled. The illumination of all the first organic luminescent field effect transistors OLET_1 constitutes the previous frame picture.

When the subsequent frame is displayed, the scan signals are input to the gate lines GATE_1/GATE_2, and each of the data lines DATA_1/DATA_2 provides the low-level data voltage. The second organic luminescent field effect transistors OLET_2 in the display substrate emit line by line. By controlling the magnitude of the low-level data voltage in each of the data lines DATA_1/DATA_2, the illumination brightness of each of the second organic luminescent field effect transistors OLET_2 can be controlled. The illumination of all the second organic luminescent field effect transistors OLET_2 constitutes the next frame picture.

Although the previous frame and the subsequent frame are alternately displayed, the user will perceive a complete picture due to the visual persistence.

It can be seen that the technical solution of the present disclosure can realize the control of the luminance of the organic luminescent field effect transistors in the adjacent two columns of sub-pixel regions by using one column of data line. As such, the number of data lines in the display substrate can be halved, and the number of sub-pixel regions that can be disposed in the display substrate is increased, which is advantageous for high-resolution products.

It should be noted that, in the embodiments, that the first organic luminescent field effect transistor OLET_1 is an N-type transistor and the second organic luminescent field effect transistor OLET_2 is a P-type transistor only serves as an example. In some embodiments of the present disclosure, the first organic luminescent field effect transistor OLET_1 is a P-type transistor and the second organic luminescent field effect transistor OLET_2 is an N-type transistor, and the details are not described again herein.

In some embodiments, two organic luminescent field effect transistors in each of the organic luminescent apparatuses connected to the data lines of the odd-numbered columns emit green light and red light, respectively. Two organic luminescent field effect transistors in each of the organic luminescent apparatuses connected to the data lines of the even-numbered columns emit green light and blue light, respectively. As such, the display substrate can display a color picture.

Another example of the present disclosure provides a display driving method for a display apparatus, wherein the display apparatus adopts a display substrate according to one embodiment of the present disclosure. The driving method of the display apparatus includes inputting a scan signal to each gate line one by one according to a first scan period. Each of the first scanning periods is divided into a first half period and a second half period. In the first half period, the data line provides a first type of data voltage, and in the second half period, the data line provides a second type of data voltage. One of the first type of data voltage and the second type of data voltage is a high level data voltage, and the other is a low level data voltage.

Another example of the present disclosure provides a display driving method for a display apparatus, wherein the display apparatus adopts the display substrate according to one embodiment of the present disclosure. Each complete picture displayed by the display substrate includes: a previous frame and a subsequent frame. In one embodiment, the driving method of the display substrate includes the following:

When the previous frame is displayed, the scan signals are input to the respective gate lines one by one according to the second scan period, wherein the data lines provide the first type of data voltages in each of the second scan periods.

When the subsequent frame is displayed, the scan signals are input to the respective gate lines one by one according to the second scan period, wherein the data lines all provide the second type of data voltage in each of the second scan periods. One of the first type of data voltage and the second type of data voltage is a high level data voltage, and the other is a low level data voltage.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. An organic luminescent substrate, comprising:
a first organic luminescent field effect transistor, comprising a first gate electrode, a first electrode, a second electrode, and a first active luminescent layer and
a second organic luminescent field effect transistor, comprising a second gate electrode, a third electrode, a fourth electrode, and a second active luminescent layer;
wherein one of the first organic luminescent field effect transistor and the second organic luminescent field effect transistor is an N-type transistor and the other one is a P-type transistor;
the first gate electrode is directly connected internally to the second gate electrode below the first active luminescent layer and the second active luminescent layer;
the first electrode and the second electrode each have a comb shape comprising a comb tooth portion, an orthographic projection of the comb tooth portion of the first electrode on a plane where the first gate electrode is and an orthographic projection of the comb tooth portion of the second electrode on the plane where the first gate electrode is are alternately disposed; and
the third electrode and the fourth electrode each have a comb shape comprising a comb tooth portion, an orthographic projection of the comb tooth portion of the third electrode on a plane where the second gate electrode is and an orthographic projection of the comb tooth portion of the fourth electrode on the plane where the second gate electrode is are alternately disposed.

2. The organic luminescent substrate of claim 1, wherein the second electrode is coupled to the fourth electrode, the first electrode and the second electrode are both coupled to the first active luminescent layer, and the third electrode and the fourth electrode are both coupled to the second active luminescent layer.

3. The organic luminescent substrate of claim 1, wherein the first active luminescent layer comprises a first organic luminescent semiconductor material; the second active luminescent layer comprises a second organic luminescent semiconductor material; one of the first organic luminescent semiconductor material and the second organic luminescent semiconductor material is an N type organic luminescent semiconductor material, and the other one is a P type organic luminescent semiconductor material.

4. The organic luminescent substrate of claim 1, wherein the first active luminescent layer comprises a first active layer and a first luminescent layer on a side of the first active layer;
the second active luminescent layer comprises a second active layer and a second luminescent layer on a side of the second active layer; and
the first active layer and the second active layer are in a same layer, and the first luminescent layer and the second luminescent layer are in a same layer.

5. The organic luminescent substrate of claim 4, wherein an orthographic projection of the first luminescent layer on a plane where the first active layer is located covers a partial region of the first active layer, the first electrode is coupled to a region on a side of the first active layer opposite from the base substrate and not covered by the first luminescent layer, and an orthographic projection of the first electrode on the plane where the first active layer is located does not overlap an orthographic projection of the first luminescent layer on the plane where the first active layer is located; and
an orthographic projection of the second luminescent layer on a plane where the second active layer is covers a partial region of the second active layer, the third electrode is coupled to a region on a side of the second active layer opposite from the base substrate and not covered by the second luminescent layer, and an orthographic projection of the third electrode on the plane where the second active layer is does not overlap the orthographic projection of second luminescent layer on the plane where the second active layer is.

6. The organic luminescent substrate of claim 1, wherein an orthographic projection of the second electrode on a plane where the first active luminescent layer is located does not overlap the first active luminescent layer; and an orthographic projection of the fourth electrode on a plane where the second active luminescent layer is does not overlap the second active luminescent layer.

7. The organic luminescent substrate of claim 6, further comprising a transparent electrode, wherein the transparent electrode couples the first active luminescent layer with the second electrode, and couples the second active luminescent layer with the fourth electrode.

8. The organic luminescent substrate of claim 1, wherein the first active luminescent layer and the second active luminescent layer are configured to emit light of different colors in a conductive state.

9. The organic luminescent substrate of claim 1, wherein the first electrode is electrically coupled to the third electrode.

10. A display apparatus, comprising the organic luminescent substrate according to claim 1.

11. The display apparatus of claim 10, further comprising a plurality of gate lines and a plurality of data lines, the plurality of the gate lines and the plurality of the data lines defining a plurality of display areas arranged in an array, and the organic luminescent substrate has a one-to-one correspondence with each of the plurality of the display areas, each of the plurality of the display areas comprising a first sub-pixel region and a second sub-pixel region, the first organic luminescent field effect transistor is located in the corresponding first sub-pixel region, and the second organic luminescent field effect transistor is located in the corresponding second sub-pixel region.

12. The display apparatus of claim 11, further comprising a switching transistor, wherein the switching transistor has a one-to-one correspondence with the organic luminescent substrate, a gate electrode of the switching transistor is coupled to a corresponding one of the plurality of the gate lines, a source of the switching transistor is coupled to a corresponding one of the plurality of the data lines, and a drain of the switching transistor is coupled to the first gate electrode and the second gate electrode of the corresponding organic luminescent apparatus.

* * * * *